(12) United States Patent
Obara et al.

(10) Patent No.: US 9,125,308 B2
(45) Date of Patent: Sep. 1, 2015

(54) SEMICONDUCTOR DEVICE AND METHOD OF MANUFACTURING THEREOF

(71) Applicants: Taichi Obara, Tokyo (JP); Rei Yoneyama, Tokyo (JP); Hiroyuki Okabe, Tokyo (JP)

(72) Inventors: Taichi Obara, Tokyo (JP); Rei Yoneyama, Tokyo (JP); Hiroyuki Okabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 154 days.

(21) Appl. No.: 13/828,142

(22) Filed: Mar. 14, 2013

(65) Prior Publication Data

US 2013/0286622 A1 Oct. 31, 2013

(30) Foreign Application Priority Data

Apr. 26, 2012 (JP) ................................. 2012-101297

(51) Int. Cl.
*H05K 1/00* (2006.01)
*H05K 1/02* (2006.01)
*H05K 3/36* (2006.01)

(52) U.S. Cl.
CPC .............. *H05K 1/0296* (2013.01); *H05K 3/368* (2013.01); *H01L 2224/48091* (2013.01); *H01L 2924/13055* (2013.01); *H01L 2924/19107* (2013.01); *H05K 2201/042* (2013.01); *H05K 2201/10356* (2013.01); *Y10T 29/49126* (2015.01)

(58) Field of Classification Search
CPC ........... H01L 2224/48091; H01L 2924/00014; H01L 2924/19107; H05K 1/0296; H05K 2201/042; H05K 2201/10356; H05K 3/368

USPC ................. 361/792, 803, 749, 750, 751, 776; 174/254, 256, 259, 260, 261
See application file for complete search history.

(56) References Cited

U.S. PATENT DOCUMENTS

| | | | | |
|---|---|---|---|---|
| 5,288,950 A | * | 2/1994 | Ushio et al. | 174/254 |
| 5,428,190 A | * | 6/1995 | Stopperan | 174/261 |
| 5,920,465 A | * | 7/1999 | Tanaka | 361/784 |
| 6,531,662 B1 | * | 3/2003 | Nakamura | 174/255 |
| 7,479,345 B2 | * | 1/2009 | Nakamura | 429/129 |
| 2003/0013013 A1 | | 1/2003 | Nakamura | |
| 2013/0286618 A1 | | 10/2013 | Shibasaki et al. | |

FOREIGN PATENT DOCUMENTS

| | | |
|---|---|---|
| JP | S48-060075 U | 7/1973 |
| JP | S53-40476 U | 4/1978 |

(Continued)

OTHER PUBLICATIONS

An Office Action; "Notification of Reason for Rejection," issued by the Japanese Patent Office on Sep. 24, 2014, which corresponds to Japanese Patent Application No. 2012-101297 and is related to U.S. Appl. No. 13/828,142; with English language partial translation.

*Primary Examiner* — Yuriy Semenenko
(74) *Attorney, Agent, or Firm* — Studebaker & Brackett PC

(57) ABSTRACT

A semiconductor device includes a first printed circuit board, a flat cable having electrical wires and a coating film which covers the electrical wires except for both ends, one end of each of the electrical wires is connected to the first printed circuit board, and a second printed circuit board connected to other end of each of the electrical wires. The flat cable is bent in such a manner that the first printed circuit board and the second printed circuit board face each other. A flat surface is formed in a portion of the coating film.

9 Claims, 6 Drawing Sheets

(56) References Cited

FOREIGN PATENT DOCUMENTS

| | | |
|---|---|---|
| JP | S59-43593 A | 3/1984 |
| JP | H08-203351 A | 8/1996 |
| JP | H10-146066 A | 5/1998 |
| JP | 2001-143539 A | 5/2001 |
| JP | 2002-368372 A | 12/2002 |
| JP | 2003-60159 A | 2/2003 |
| JP | 2004-297972 A | 10/2004 |
| JP | 2005-183495 A | 7/2005 |
| JP | 2007-181257 A | 7/2007 |
| JP | 2010-105640 A | 5/2010 |
| JP | 2010-165914 A | 7/2010 |
| JP | 2010-232254 A | 10/2010 |
| JP | 2011-028984 A | 2/2011 |
| WO | 00/65888 A1 | 11/2000 |
| WO | 2012/039114 A1 | 3/2012 |

\* cited by examiner

SEMICONDUCTOR DEVICE AND METHOD OF MANUFACTURING THEREOF

BACKGROUND OF THE INVENTION

1. Field of the Invention

The present invention relates to a semiconductor device used, e.g., for high power control, and a method of manufacturing thereof.

2. Background Art

International Patent Application Publication No. WO00/65888 discloses a technique for connecting a plurality of substrates together by means of a joint member. The joint member has a plurality of leads held together by base films. The joint member can be bent in any direction. Japanese Laid-Open Patent Publication No. 2010-232254 discloses a technique for connecting a plurality of ceramic substrates together by means of bent wiring patterns.

Connecting a plurality of substrates together by means of terminals typically requires that such terminals be mounted on the substrates, resulting in a reduced component mounting area of the substrates. Therefore, it is desirable to connect a plurality of substrates without using terminals, as disclosed in the above publications.

However, the joint member disclosed in the above Publication No. WO00/65888 is disadvantageous in that the joint member is manufactured by sandwiching a plurality of parallelly arranged leads between upper and lower base films and then bonding these base films together, which requires a dedicated machine tool resulting in increased manufacturing cost. In order to avoid this problem, a flat cable may be used for connecting a plurality of substrates together. However, since flat cables have an irregular surface, they cannot be automatically transferred by a holding device such as a suction holding device, resulting in reduced throughput of the manufacturing process.

The technique disclosed in the above Publication No. 2010-232254 is disadvantageous in that in order to cut a ceramic substrate into a plurality of smaller substrates, small holes are formed in the ceramic substrate by irradiating the substrate with one laser pulse at a time while avoiding damage to the wiring patterns connected to the substrate, meaning that this cutting process requires significant time to complete, thus reducing the throughput of the manufacturing process.

SUMMARY OF THE INVENTION

It is, therefore, an object of the present invention to provide a semiconductor device whose substrates have an increased component mounting area and which can be manufactured with increased throughput. Another object of the invention is to provide a method of manufacturing such a semiconductor device.

The features and advantages of the present invention may be summarized as follows.

According to one aspect of the present invention, a semiconductor device includes a first printed circuit board, a flat cable having electrical wires and a coating film which covers the electrical wires except for both ends, one end of each of the electrical wires is connected to the first printed circuit board, and a second printed circuit board connected to other end of each of the electrical wires, wherein the flat cable is bent in such a manner that the first printed circuit board and the second printed circuit board face each other, and wherein a flat surface is formed in a portion of the coating film.

According to another aspect of the present invention, a method of manufacturing a semiconductor device includes the steps of forming a flat surface in a portion of a coating film of a flat cable, the coating film covers electrical wires except for both ends, holding the flat cable by a holding device in such a way that a flat attachment surface of the holding device is brought into contact with the flat surface of the flat cable, transferring the flat cable by the holding device so that the flat cable engages a first printed circuit board and a second printed circuit board, connecting one end of each of the electrical wires of the flat cable to the first printed circuit board, connecting other end of each of the electrical wires to the second printed circuit board, and bending the flat cable in such a manner that the first printed circuit board and the second printed circuit board face each other.

Other and further objects, features and advantages of the invention will appear more fully from the following description.

DETAILED DESCRIPTION OF THE PREFERRED EMBODIMENTS

First Embodiment

Figure 1:
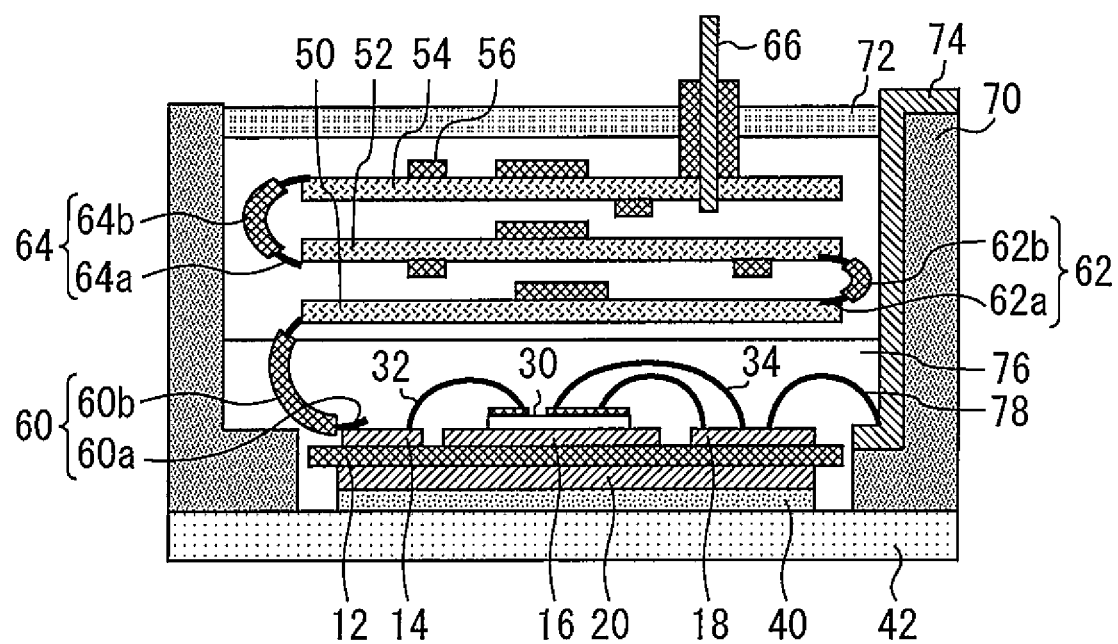
FIG. 1 is a cross-sectional view of a semiconductor device in accordance with a first embodiment of the present invention.

FIG. 1 is a cross-sectional view of a semiconductor device in accordance with a first embodiment of the present invention. The semiconductor device 10 has an insulating substrate 12. Wiring patterns 14, 16, and 18 are formed on the top surface of the insulating substrate 12. A bottom pattern 20 is formed on the bottom surface of the insulating substrate 12.

A semiconductor element 30 is secured onto the insulating substrate 12 by solder, etc. (not shown), with the wiring pattern 16 interposed between the semiconductor element 30 and the insulating substrate 12. The semiconductor element 30 is, e.g., an IGBT. The gate of the semiconductor element 30 is connected to the wiring pattern 14 by a wire 32. The emitter of the semiconductor element 30 is connected to the wiring pattern 18 by a wire 34. The collector of the semiconductor element 30 is connected to the wiring pattern 16 by solder, etc. (not shown). It should be noted that the bottom pattern on the bottom surface of the insulating substrate 12 is secured to a base plate 42 by solder 40.

A first printed circuit board 50 is provided above the insulating substrate 12. A second printed circuit board 52 is provided above the first printed circuit board 50. A third printed circuit board 54 is provided above the second printed circuit board 52. The first printed circuit board 50, the second printed circuit board 52, and the third printed circuit board 54 may be referred to collectively as the printed circuit boards 50, 52, and 54. Circuit components 56 are secured to the printed circuit boards 50, 52, and 54.

The wiring pattern 14 is connected to the first printed circuit board 50 by a flat cable 60. The flat cable 60 includes electrical wires 60a and a coating film 60b which covers the electrical wires 60a except for both ends. One end of each electrical wire 60a is electrically connected to the semiconductor element 30 through the wiring pattern 14 and the wire 32. The other end of each electrical wire 60a is connected to the first printed circuit board 50. The connection of one end of each electrical wire 60a to the wiring pattern 14 and the connection of the other end of each electrical wire 60a to the first printed circuit board 50 are accomplished by means of, e.g., soldering or ultrasonic bonding.

The flat cable 62, like the flat cable 60, includes electrical wires 62a and a coating film 62b. One end of each electrical wire 62a is connected to the first printed circuit board 50. The other end of each electrical wire 62a is connected to the second printed circuit board 52. The flat cable 62 is bent in such a manner that the first printed circuit board 50 and the second printed circuit board 52 face each other.

The flat cable 64, like the flat cable 60, includes electrical wires 64a and a coating film 64b. One end of each electrical wire 64a is connected to the second printed circuit board 52. The other end of each electrical wire 64a is connected to the third printed circuit board 54. The flat cable 64 is bent in such a manner that the second printed circuit board 52 and the third printed circuit board 54 face each other.

The coating films 60b, 62b, and 64b are formed of thermoplastic resin. The electrical wires 60a, 62a, and 64a are formed of a conductor. The flat cables 60, 62, and 64 have some degree of rigidity although they can be bent.

The components described above are covered by the base plate 42, a case 70 formed on the base plate 42, and a lid 72 formed above the base plate 42. A power terminal 74 is attached to the inside of the case 70 and extends partially outwardly from the case 70. The power terminal 74 is connected to the wiring pattern 18 by a wire 78. A control terminal 66 is attached to the third printed circuit board 54. The control signal for the semiconductor element 30 is input to the control terminal 66 and passed through the printed circuit boards 50, 52, and 54 to the gate of the semiconductor element 30.

Figure 2:
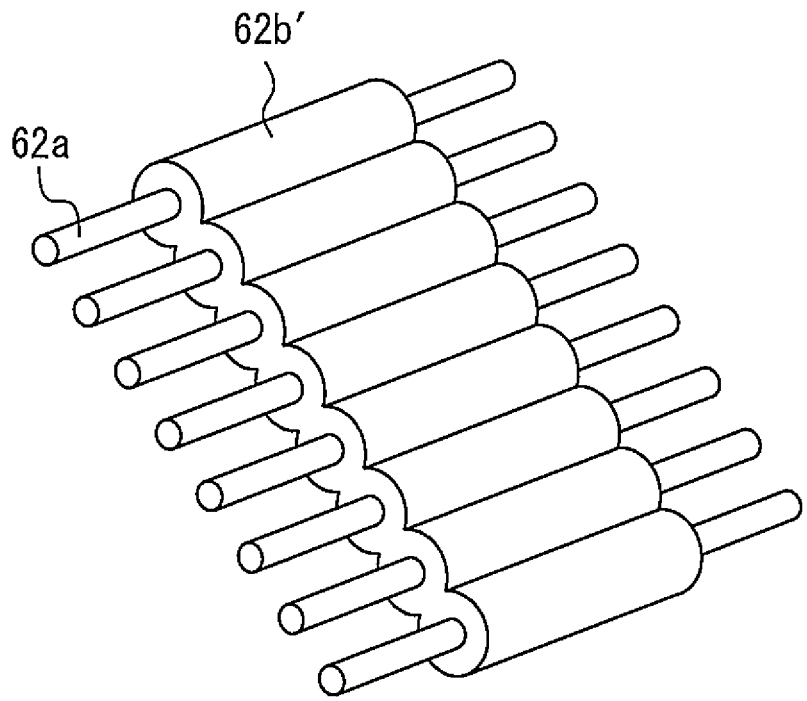
FIG. 2 is a perspective view of the flat cable before the flat surface is formed therein.

A method of manufacturing the semiconductor device 10 of the first embodiment will now be described. First, a flat surface is formed in a portion of the coating film of a flat cable. This step is referred to herein as the flat surface forming step. FIG. 2 is a perspective view of the flat cable before the flat surface is formed therein. The flat cable is made up of electrical wires 62a and a coating film 62b' which concentrically covers the electrical wires 62a and hence has a surface comprised of a series of intersecting arched surfaces.

Figure 3:
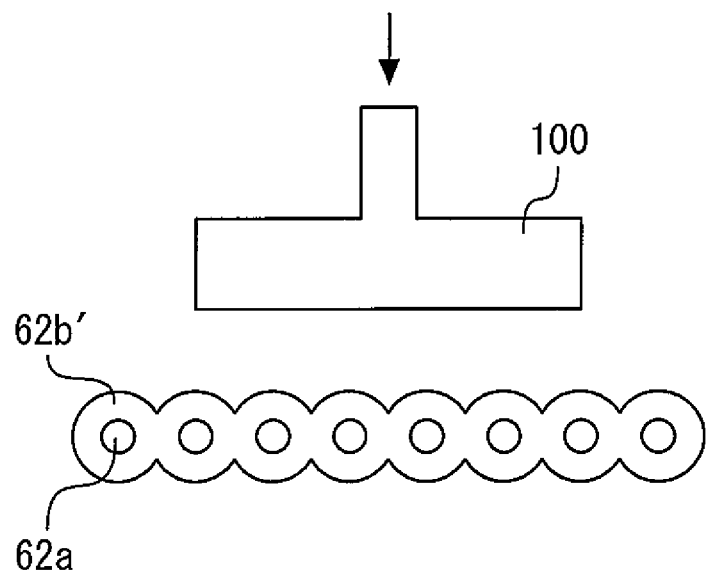
FIG. 3 is diagrams showing the way in which the flat surface is formed by a hot press machine.
Figure 4:
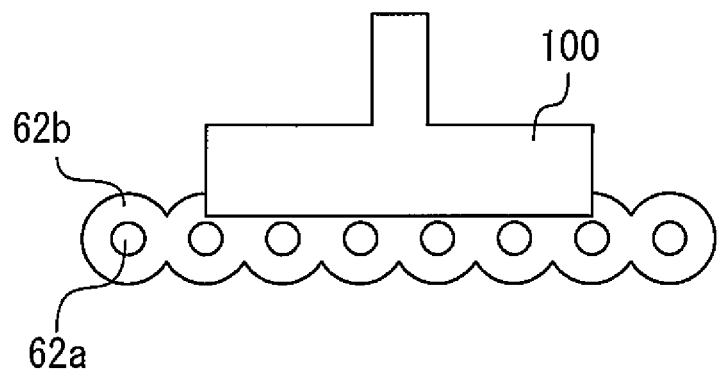
FIG. 4 is diagrams showing the way in which the flat surface is formed by a hot press machine.

FIGS. 3 and 4 are diagrams showing the way in which the flat surface is formed by a hot press machine. First, the hot press machine 100 is moved toward the coating film 62b', as shown in FIG. 3. Then as shown in FIG. 4, a flat surface of the hot press machine 100 is pressed against the coating film 62b', thereby forming a flat surface in the coating film 62b'. Since the coating film 62b' is formed of thermoplastic resin, this flat surface can be easily formed by a hot press machine.

Figure 5:
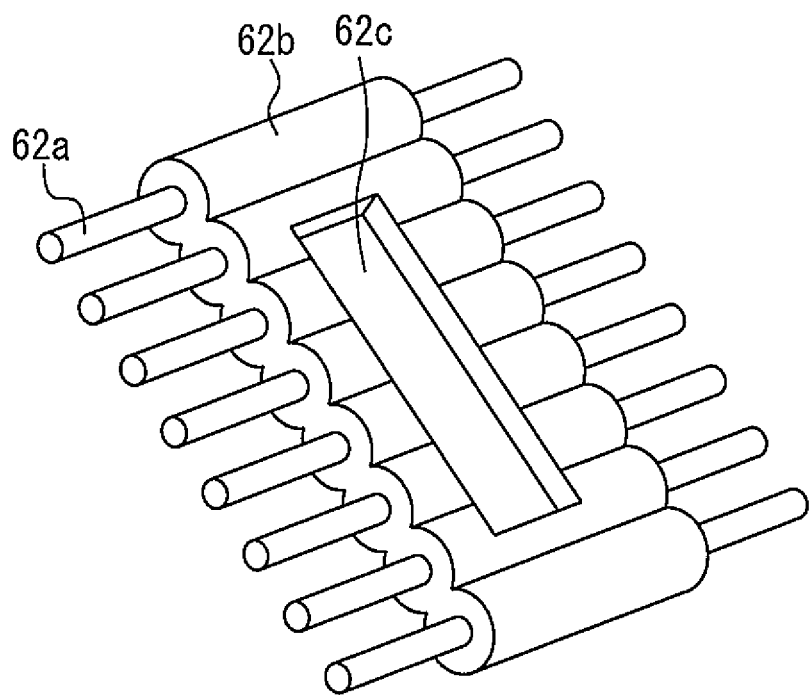
FIG. 5 is a perspective view of the flat cable after the flat surface has been formed therein.

FIG. 5 is a perspective view of the flat cable after the flat surface has been formed therein. The flat surface, 62c, has an elongated shape extending substantially perpendicular to the electrical wires 62a. Next, a flat surface is formed in the flat cables 60 and 64 in the same manner as in the flat cable 62.

Figure 6:
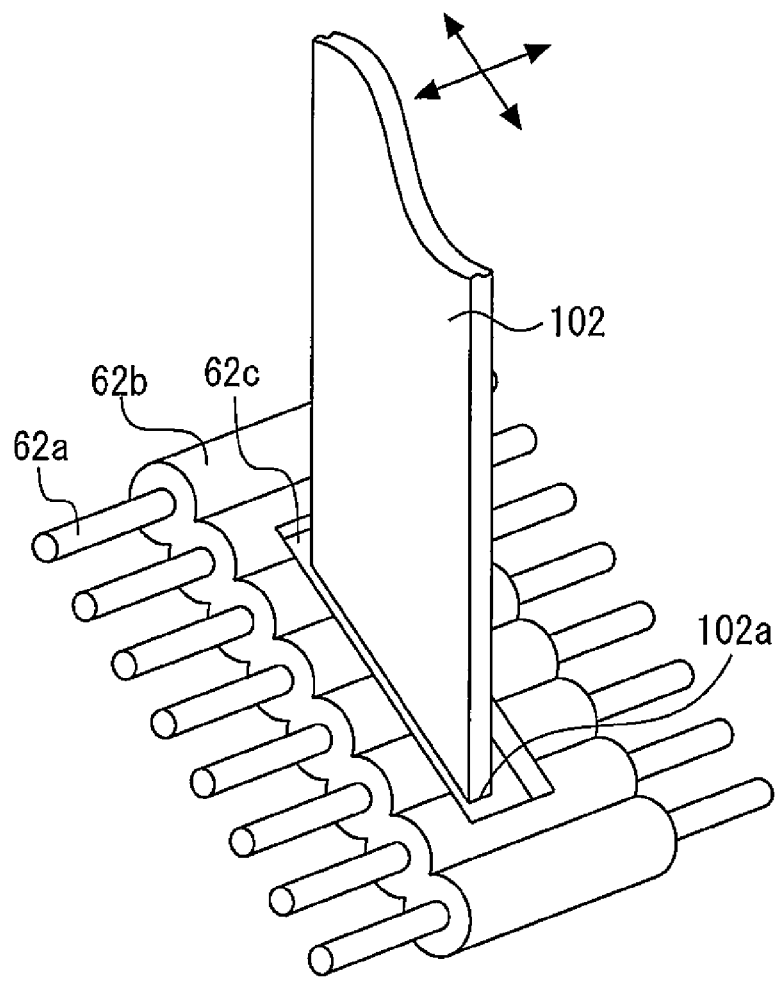
FIG. 6 is a perspective view showing the flat cable held by the holding device.

The flat cable 62 is then held by a holding device such as a suction holding device and moved so that the flat cable 62 engages the first printed circuit board 50 and the second printed circuit board 52. One end of the flat cable 62 is then connected to the first printed circuit board 50 and the other end of the flat cable 62 is connected to the second printed circuit board 52. This step is referred to herein as the connection step. FIG. 6 is a perspective view showing the flat cable held by the holding device. The flat attachment surface 102a of the holding device 102 is brought into contact with the flat surface 62c of the flat cable 62 so that the flat cable 62 is held to the holding device 102. The flat cable 62 can then be automatically transferred by use of the holding device 102.

Figure 7:
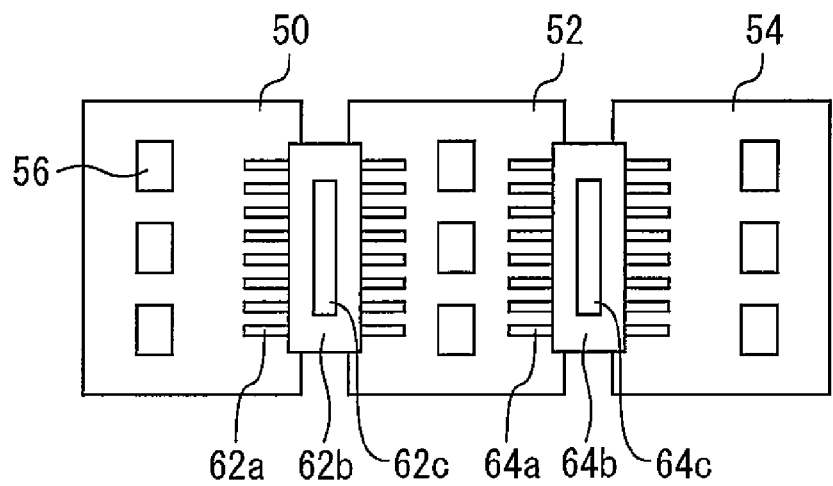
FIG. 7 is a plan view showing flat cables, etc. after the connection step.

FIG. 7 is a plan view showing flat cables, etc. after the connection step. Specifically, after the printed circuit boards 50, 52, and 54 are laid out on a flat surface, the flat cable 62 is automatically transferred by the holding device 102 so that the flat cable 62 engages the first printed circuit board 50 and the second printed circuit board 52. One end of each electrical wire 62a of the flat cable 62 is then connected to the first printed circuit board 50 and the other end of each electrical wire 62a is connected to the second printed circuit board 52. Likewise, the flat cable 64 is automatically transferred by the holding device 102 so that the flat cable 64 engages the second printed circuit board 52 and the third printed circuit board 54. One end of each electrical wire 64a of the flat cable 64 is then connected to the second printed circuit board 52 and the other end of each electrical wire 64a is connected to the third printed circuit board 54. These connections are accomplished by means of, e.g., soldering or ultrasonic bonding.

Next, the flat cable 62 is bent in such a manner that the first printed circuit board 50 and the second printed circuit board 52 face each other. Further, the flat cable 64 is bent in such a manner that the second printed circuit board 52 and the third printed circuit board 54 face each other. This step is referred to herein as the bending step. As a result of this bending step, the printed circuit boards 50, 52, and 54 are stacked on top of one another with a space between them. The printed circuit boards 50, 52, and 54 which have been held together by the flat cables 62 and 64 are then mounted in a case and are connected to components as shown in FIG. 1, thereby completing the manufacture of the semiconductor device 10.

In the semiconductor device 10 of the first embodiment, the flat cables 62 and 64 have a flat surface formed therein, making it possible to pick up these flat cables by use of the holding device 102 and automatically transfer them. This increases the throughput of the manufacturing process.

Since the flat surface 62c of the flat cable 62 has an elongated shape extending substantially perpendicular to the electrical wires 62a of the flat cable 62, the flat cable 62 can be bent along the flat surface 62c in the bending step. That is, the portion of the flat cable 62 in which the flat surface 62c is formed is less rigid than the other portions of the flat cable 62, facilitating the bending of the flat cable 62. Since, as described above, the flat cables 60 and 64 have a configuration similar to that of the flat cable 62, they can also be easily bent in the same manner as the flat cable 62.

In the semiconductor device 10 of the first embodiment, the printed circuit boards 50, 52, and 54 are electrically connected together by means of the flat cables 62 and 64, thereby eliminating the need for terminals for connecting these printed circuit boards. This means that there is no need to mount such terminals on the printed circuit boards 50, 52, and 54, so that these printed circuit boards can have an increased area for mounting components such as the components 56 shown in FIG. 1. Further, the first printed circuit board 50 and the semiconductor element 30 are connected together by the flat cable 60, avoiding the use of terminals that would otherwise be needed to connect the first printed circuit board 50 and the semiconductor element 30.

The flat cable 60 is provided in order to avoid employing terminals on the first printed circuit board 50, which would otherwise result in a reduced component mounting area of the first printed circuit board 50. Therefore, the flat cable 60 may be replaced by any lead wires. For example, bonding wires may be used instead of the flat cable 60.

The present invention is applied to semiconductor devices having a plurality of stacked substrates and makes it possible to increase the throughput of the manufacturing process of such semiconductor devices by using a simple method, as well as to increase the component mounting area of the substrates. Therefore, the present invention is not limited by the type of semiconductor element and the number and function of substrates used in semiconductor devices.

Second Embodiment

Figure 8:
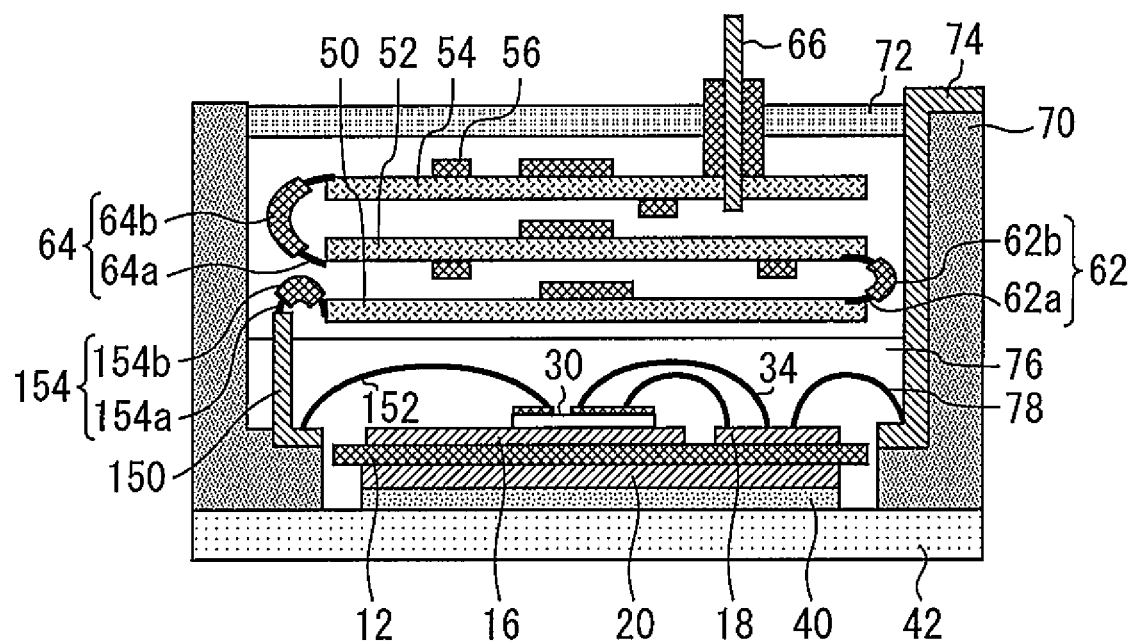
FIG. 8 is a cross-sectional view of the semiconductor device of the second embodiment.

A second embodiment of the present invention provides a semiconductor device and a method of manufacturing thereof which have many features common to the semiconductor device and the method of manufacturing thereof of the first embodiment. Therefore, the following description of the second embodiment will be primarily limited to the differences from the first embodiment. FIG. 8 is a cross-sectional view of the semiconductor device of the second embodiment. This semiconductor device has a junction terminal 150. The lower part of the junction terminal 150 is secured to the case 70.

The junction terminal 150 is connected to the semiconductor element 30 by a wire 152. A flat cable 154 is connected to the upper part of the junction terminal 150. One end of the flat cable 154 is connected to the first printed circuit board 50, and the other end of the flat cable 154 is connected to the junction terminal 150. It should be noted that the flat cable 154 is identical to the flat cable 62.

Connecting the first printed circuit board 50 and the wiring pattern 14 by means of the flat cable 60, as in the first embodiment, requires rather complicated work, which may reduce the throughput of the manufacturing process. In the semiconductor device of the second embodiment, on the other hand, the junction terminal 150 extends a substantial distance upward within the case 70, making it possible to easily connect the other end of the flat cable 154 to the junction terminal 150. Therefore, the manufacturing method of the second embodiment enables the throughput of the manufacturing process to be increased, as compared with the manufacturing method of the first embodiment. It should be noted that the semiconductor device of the second embodiment is susceptible of alterations at least similar to those that can be made to the semiconductor device of the first embodiment.

Third Embodiment

Figure 9:
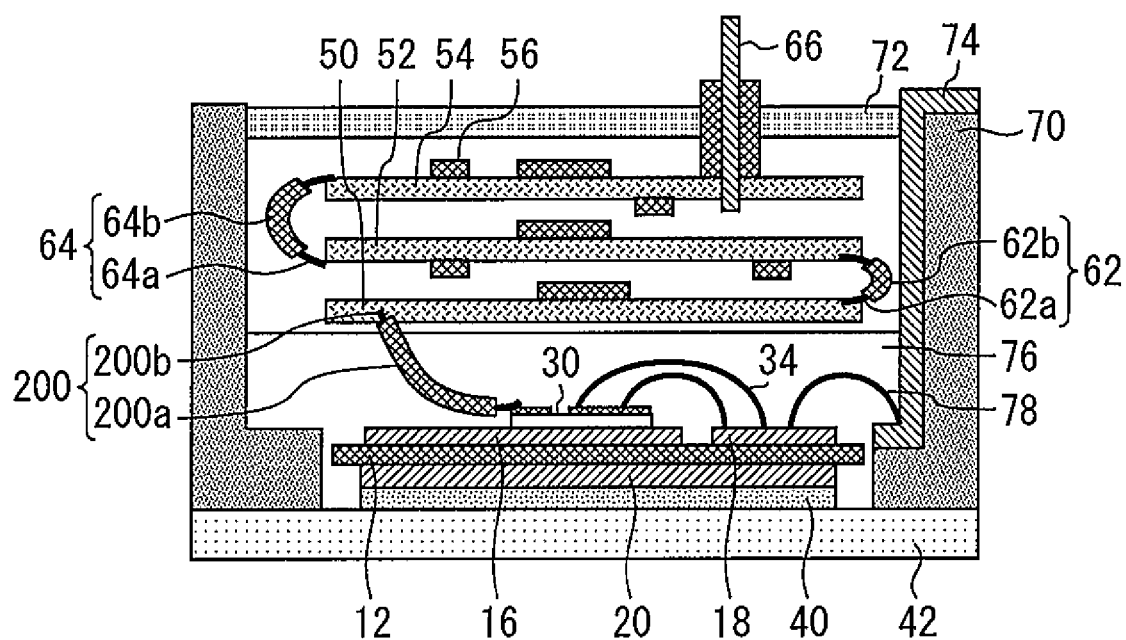
FIG. 9 is a cross-sectional view of the semiconductor device of the third embodiment.

A third embodiment of the present invention provides a semiconductor device and a method of manufacturing thereof which have many features common to the semiconductor device and the method of manufacturing thereof of the first embodiment. Therefore, the following description of the third embodiment will be primarily limited to the differences from the first embodiment. FIG. 9 is a cross-sectional view of the semiconductor device of the third embodiment. This semiconductor device has a flat cable 200. One end of the flat cable 200 is connected to the first printed circuit board 50, and the other end of the flat cable 200 is connected to the semiconductor element 30. It should be noted that the flat cable 200 is identical to the flat cable 62.

Thus, the first printed circuit board 50 and the semiconductor element 30 are connected by the flat cable 200, thereby eliminating the need for the wiring pattern 14 and the wire 32 shown in FIG. 1 and the junction terminal 150 shown in FIG. 8. This makes it possible to reduce the cost of the semiconductor device. It should be noted that the semiconductor device of the third embodiment is susceptible of alterations at least similar to those that can be made to the semiconductor device of the first embodiment.

The features and advantages of the present invention may be summarized as follows. The present invention enables a flat cable to be used for connecting a plurality of substrates together, making it possible to increase the component mounting area of these substrates. Further, since the flat cable of the present invention has a flat surface on a portion thereof, it is possible to increase the throughput of the manufacturing process of semiconductor devices incorporating this flat cable.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2012-101297, filed on Apr. 26, 2012 including specification, claims, drawings and summary, on which the Convention priority of the present application is based, are incorporated herein by reference in its entirety.

What is claimed is:

1. A semiconductor device comprising:
   a first printed circuit board;
   a flat cable having electrical wires and a coating film concentrically covering said electrical wires to form a series of intersecting arched surfaces, except for both ends, one end of each of said electrical wires is connected to said first printed circuit board; and
   a second printed circuit board connected to other end of each of said electrical wires,
   wherein said flat cable is bent in such a manner that said first printed circuit board and said second printed circuit board face each other, and
   wherein a portion of said intersecting arched surfaces is formed into a flat surface recessed into said coating film and extending transversely to said electrical wires.

2. The semiconductor device according to claim 1, wherein said coating film is formed of thermoplastic resin.

3. The semiconductor device according to claim 1, wherein said flat surface has an elongated shape extending perpendicular to said electrical wires.

4. The semiconductor device according to claim 1, further comprising:
   an insulating substrate;
   a semiconductor element secured onto said insulating substrate; and
   a lead wires whose one ends are electrically connected to said semiconductor element, and whose other ends are electrically connected to said first printed circuit board.

5. The semiconductor device according to claim 4, further comprising:
   a wire connected to said semiconductor element; and
   a junction terminal connected to said wire,
   wherein said one ends of said lead wires are connected to said junction terminal.

6. The semiconductor device according to claim 4, wherein said one ends of said lead wires are connected to said semiconductor element.

7. The semiconductor device according to claim 4, wherein said lead wires are flat cable or bonding wires.

8. The semiconductor device according to claim 1, wherein said flat surface has an elongated shape, and wherein the flat cable is bent along the flat surface.

9. A method of manufacturing a semiconductor device, comprising the steps of:

forming a recessed flat surface in a portion of a coating film of a flat cable, said coating film concentrically covers electrical wires to form a series of intersecting arched surfaces, except for both ends, and said recessed flat surface extending transversely to said electrical wires;

holding said flat cable by a holding device in such a way that a flat attachment surface of said holding device is brought into contact with said flat surface of said flat cable, transferring said flat cable by said holding device so that said flat cable engages a first printed circuit board and a second printed circuit board;

connecting one end of each of said electrical wires of said flat cable to said first printed circuit board;

connecting other end of each of said electrical wires to said second printed circuit board; and bending said flat cable in such a manner that said first printed circuit board and said second printed circuit board face each other.

\* \* \* \* \*